(12) United States Patent
Jiang et al.

(10) Patent No.: US 11,575,108 B2
(45) Date of Patent: Feb. 7, 2023

(54) DISPLAY PANEL, PREPARATION METHOD THEREOF, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Zhiliang Jiang, Beijing (CN); Pan Zhao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 66 days.

(21) Appl. No.: 16/934,165

(22) Filed: Jul. 21, 2020

(65) Prior Publication Data
US 2021/0066655 A1    Mar. 4, 2021

(30) Foreign Application Priority Data

Aug. 29, 2019    (CN) .......................... 201910810364.9

(51) Int. Cl.
*H01L 27/32*    (2006.01)
*H01L 51/52*    (2006.01)
*H01L 51/56*    (2006.01)

(52) U.S. Cl.
CPC .......... *H01L 51/5253* (2013.01); *H01L 51/56* (2013.01)

(58) Field of Classification Search
CPC ............. H01L 51/5246; H01L 27/3272; H01L 27/3244; H01L 27/3211; H01L 51/5256
See application file for complete search history.

(56) References Cited

U.S. PATENT DOCUMENTS

2017/0279080 A1    9/2017    Wang et al.
2018/0033998 A1*   2/2018    Kim ...................... H01L 51/525
(Continued)

FOREIGN PATENT DOCUMENTS

CN    105789257 A    7/2016
CN    107507931 A    12/2017
(Continued)

OTHER PUBLICATIONS

Office Action for corresponding Chinese Application No. 201910810364.9 dated Apr. 19, 2021.

*Primary Examiner* — Caridad Everhart
(74) *Attorney, Agent, or Firm* — ArentFox Schiff LLP; Michael Fainberg

(57) ABSTRACT

Disclosed are a display panel and a preparation method thereof, and a display device. The display panel includes a display area and a peripheral area surrounding display area; display area includes a light emitting device, peripheral area includes a retaining wall, and display and peripheral area include a encapsulation structure covering retaining wall and light emitting device; encapsulation structure includes: a first inorganic encapsulation layer, an organic encapsulation layer, and a second inorganic encapsulation layer in sequence; first and second inorganic encapsulation layers cover display and peripheral area; organic encapsulation layer covers display area and at least part of peripheral area, and there is a gap between organic encapsulation layer and retaining wall; organic encapsulation layer and first inorganic encapsulation layer includes a middle contact surface and a peripheral contact surface surrounding middle contact surface, surface energy of middle contact surface is greater than that of peripheral contact surface.

18 Claims, 4 Drawing Sheets

(56) References Cited

U.S. PATENT DOCUMENTS

2018/0183006 A1* 6/2018 Ishida ................ H01L 51/5256
2019/0198587 A1* 6/2019 Park .................... H01L 51/5237
2020/0220103 A1* 7/2020 Huang ................ H01L 51/5256

FOREIGN PATENT DOCUMENTS

| CN | 107623086 A | 1/2018 |
|---|---|---|
| CN | 109300943 A | 2/2019 |
| CN | 109950421 A | 6/2019 |
| CN | 110061043 A | 7/2019 |

* cited by examiner

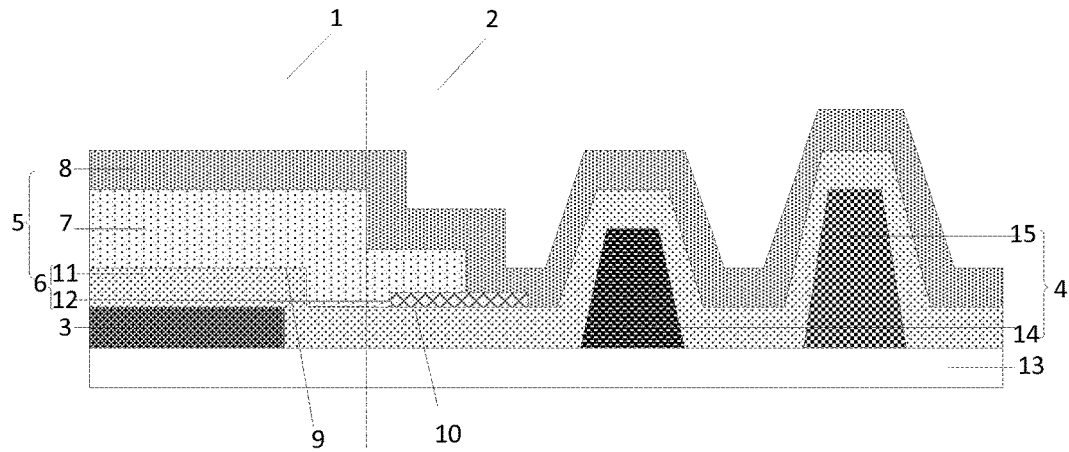

Fig. 3

| providing a substrate and forming a light emitting device and a retaining wall on the substrate; wherein the display panel is divided into a display area and a peripheral area surrounding the display area, the light emitting device is located in the display area, and the retaining wall is located in the peripheral area | S101 |

↓

| forming a first inorganic encapsulation layer covering the display area and the peripheral area | S102 |

↓

| forming a pattern of an organic encapsulation layer covering the display area and at least part of the peripheral area on the first inorganic encapsulation layer, wherein there is a gap between the organic encapsulation layer and the retaining wall, a contact surface between the organic encapsulation layer and the first inorganic encapsulation layer includes a middle contact surface and a peripheral contact surface surrounding the middle contact surface, and the surface energy of the middle contact surface is greater than that of the peripheral contact surface | S103 |

↓

| forming a second inorganic encapsulation layer covering the display area and the peripheral area on the organic encapsulation layer | S104 |

Fig. 4

DISPLAY PANEL, PREPARATION METHOD THEREOF, AND DISPLAY DEVICE

CROSS-REFERENCE TO RELATED APPLICATION

This application claims priority of Chinese Patent Application No. 201910810364.9, filed on Aug. 29, 2019, which is hereby incorporated by reference in its entirety.

FIELD

The present disclosure relates to the technical field of display, in particular to a display panel and a preparation method thereof, as well as a display device.

BACKGROUND

The production of active-matrix organic light-emitting diode (AMOLED) display products involves many process steps, and packaging is a key part of the production. Since a light-emitting device is highly sensitive to water and oxygen, the light-emitting device will be damaged once being invaded by water and oxygen, resulting in abnormal working of a display product.

SUMMARY

An embodiment of the present disclosure provides a display panel including a light emitting device, a retaining wall and a encapsulation structure; wherein the display panel is divided into a display area and a peripheral area surrounding the display area;

the light emitting device is in the display area, the retaining wall is in the peripheral area, and the encapsulation structure is in the display area and the peripheral area covering the retaining wall and the light emitting device;

the encapsulation structure includes: a first inorganic encapsulation layer, an organic encapsulation layer located on the first inorganic encapsulation layer, and a second inorganic encapsulation layer located on the organic encapsulation layer;

the first inorganic encapsulation layer and the second inorganic encapsulation layer cover the display area and the peripheral area;

the organic encapsulation layer covers the display area and at least part of the peripheral area, and there is a gap between the organic encapsulation layer and the retaining wall; and a contact surface between the organic encapsulation layer and the first inorganic encapsulation layer includes a middle contact surface and a peripheral contact surface surrounding the middle contact surface, and a surface energy of the middle contact surface is greater than that of the peripheral contact surface.

Optionally, the first inorganic encapsulation layer includes: an inorganic encapsulation sublayer covering the display area and the peripheral area, and a flowability modulation layer located on the inorganic encapsulation sublayer;

a surface energy of the inorganic encapsulation sublayer is less than that of the flowability modulation layer; and a contact surface between the flowability modulation layer and the organic encapsulation layer is the middle contact surface.

Optionally, materials of the inorganic encapsulation sublayer include silicon oxynitride; and materials of the flowability modulation layer include silicon oxide.

Optionally, the first inorganic encapsulation layer includes: an inorganic encapsulation sublayer covering the display area and the peripheral area, and a flowability modulation layer located on the inorganic encapsulation sublayer;

a surface energy of the inorganic encapsulation sublayer is greater than that of the flowability modulation layer; and a contact surface between the flowability modulation layer and the organic encapsulation layer includes the peripheral contact surface.

Optionally, the area of the flowabilty modulation layer is larger than that of the peripheral contact surface.

Optionally, materials of the inorganic encapsulation sublayer include silicon oxide; and the materials of the flowability modulation layer include silicon oxynitride.

Optionally, the middle contact surface at least covers the display area.

An embodiment of the present disclosure provides a preparation method of a display panel, and the method includes:

providing a substrate and forming a light emitting device and a retaining wall on the substrate; wherein the display panel is divided into a display area and a peripheral area surrounding the display area, the light emitting device is located in the display area, and the retaining wall is located in the peripheral area;

forming a first inorganic encapsulation layer covering the display area and the peripheral area;

forming a pattern of an organic encapsulation layer covering the display area and at least part of the peripheral area on the first inorganic encapsulation layer, wherein there is a gap between the organic encapsulation layer and the retaining wall, the contact surface between the organic encapsulation layer and the first inorganic encapsulation layer includes a middle contact surface and a peripheral contact surface surrounding the middle contact surface, and the surface energy of the middle contact surface is greater than that of the peripheral contact surface; and forming a second inorganic encapsulation layer covering the display area and the peripheral area on the organic encapsulation layer.

Optionally, the forming a first inorganic encapsulation layer covering the display area and the peripheral area includes performing whole-layer deposition of inorganic materials to form an inorganic encapsulation sublayer covering the display area and the peripheral area; and forming a pattern of a flowability modulation layer at least covering the display area on the inorganic encapsulation sublayer; wherein the surface energy of the inorganic encapsulation sublayer is less than that of the flowability modulation layer, and the contact surface between the flowability modulation layer and the organic encapsulation layer is the middle contact surface.

Optionally, the step of forming a first inorganic encapsulation layer covering the display area and the peripheral area includes:

performing whole-layer deposition of inorganic materials to form an inorganic encapsulation sublayer covering the display area and the peripheral area; and forming a pattern of a flowability modulation layer on the part, located in the peripheral area, of the inorganic encapsulation sublayer; wherein the surface energy of the inorganic encapsulation sublayer is greater than that of the flowability modulation layer, and the contact surface between the flowability modulation layer and the organic encapsulation layer is the peripheral contact surface.

Optionally, the method further includes the forming a touch control structure on the second inorganic encapsulation layer;

the forming a touch control structure includes:

forming a first insulation layer, a first electrode layer and a second insulation layer in sequence; and performing a patterning process on the second insulation layer and the inorganic encapsulation sublayer simultaneously to form a pattern of the inorganic encapsulation sublayer.

An embodiment of the present disclosure provides a display device, and the display device includes the display panel provided by embodiments of the present disclosure.

BRIEF DESCRIPTION OF THE DRAWINGS

In order to illustrate the technical solutions in embodiments of the present disclosure more clearly, the drawings which need to be used in the description of embodiments will be briefly introduced below. It is obvious that the drawings in the following description are only about some embodiments of the present disclosure. For those of ordinary skill in the art, other drawings may also be obtained according to the drawings without creative labor.

FIG. 3 is a schematic diagram of the structure of another display panel provided by an embodiment of the present disclosure;

FIG. 4 is a schematic diagram of a preparation method of a display panel provided by an embodiment of the present disclosure.

DETAILED DESCRIPTION OF THE EMBODIMENTS

Figure 1:
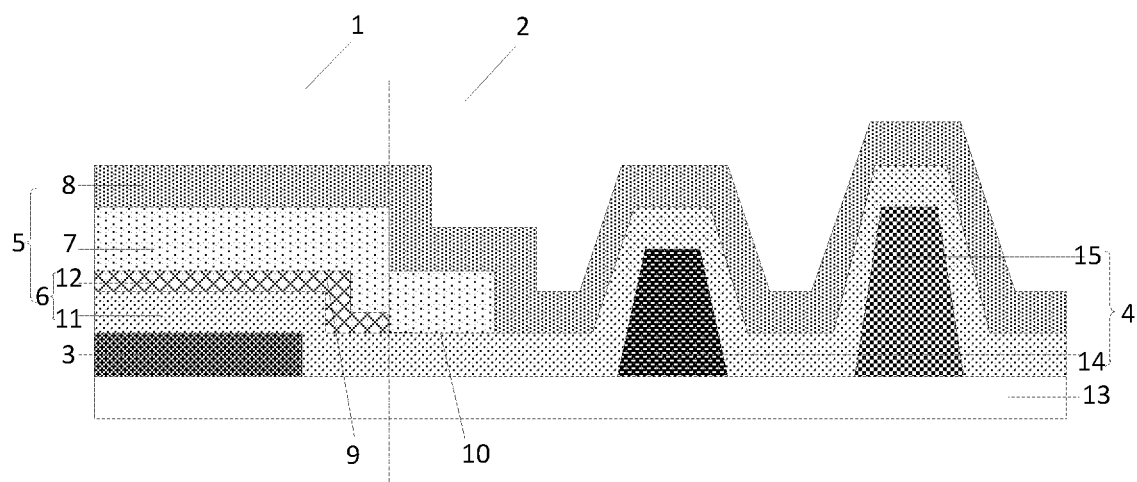
FIG. 1 is a schematic diagram of the structure of a display panel provided by an embodiment of the present disclosure.

An embodiment of the present disclosure provides a display panel, as shown in FIG. 1, the display panel is divided into a display area 1 and a peripheral area 2 surrounding the display area 1.

The display area 1 includes a light emitting device 3. The peripheral area 2 includes a retaining wall 4. The display area 1 and the peripheral area 2 further include an encapsulation structure 5 covering the retaining wall 4 and the light emitting device 3.

The encapsulation structure 5 includes: a first inorganic encapsulation layer 6, an organic encapsulation layer 7 located on the first inorganic encapsulation layer 6, and a second inorganic encapsulation layer 8 located on the organic encapsulation layer 7.

The first inorganic encapsulation layer 6 and the second inorganic encapsulation layer 8 cover the display area 1 and the peripheral area 2.

The organic encapsulation layer 7 covers the display area 1 and at least part of the peripheral area 2, and there is a gap between the organic encapsulation layer 7 and the retaining wall 4.

The contact surface between the organic encapsulation layer 7 and the first inorganic encapsulation layer 6 includes a middle contact surface 9 and a peripheral contact surface 10 surrounding the middle contact surface 9, and the surface energy of the middle contact surface 9 is greater than that of the peripheral contact surface 10.

In the display panel provided by some embodiments of the present disclosure, the contact surface between the first inorganic encapsulation layer and the organic encapsulation layer includes the middle contact surface and the peripheral contact surface, and the surface energy of the middle contact surface is greater than that of the peripheral contact surface, that is, the flowability of the organic materials in the different areas can be controlled, and the flowability of the organic materials in the middle contact surface is better than the flowability of the organic materials in the peripheral contact surface, so that the organic materials can be prevented from overflowing and crossing the retaining wall in the inkjet printing process, the invasion of the water and oxygen along a channel of the organic encapsulation layer can be avoided, and the reliability of encapsulation can be further ensured.

The display panel as shown in FIG. 1 provided by some embodiments of the present disclosure further includes a substrate 13, and the retaining wall 4 includes: a first retaining wall 14 and a second retaining wall 15 located on the side, away from the display area, of the first retaining wall 14, and the thickness of the second retaining wall 15 is larger than that of the first retaining wall 14. It should be noted that only part of the display area is shown in FIG. 1.

Figure 2:
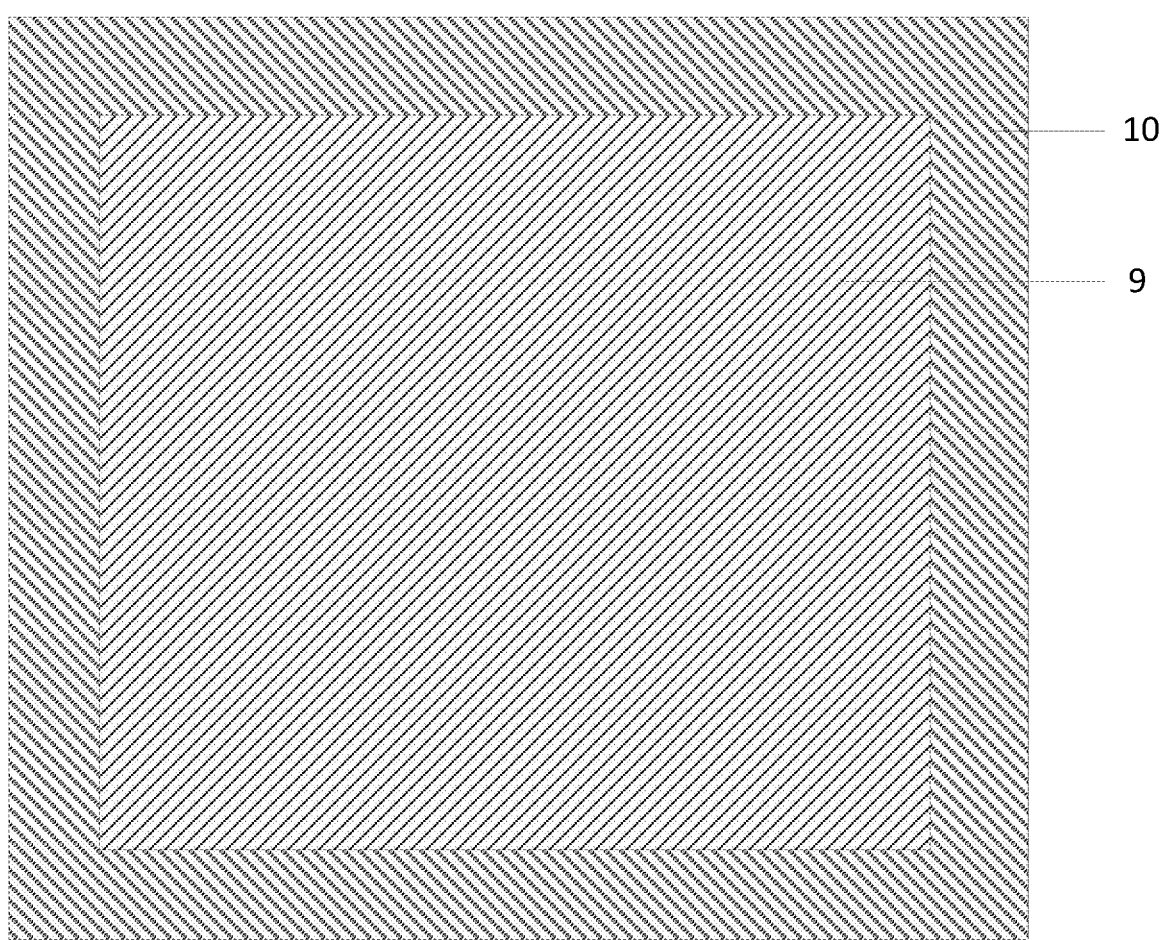
FIG. 2 is a schematic diagram of projections of a middle contact surface and a peripheral contact surface of a display panel provided by an embodiment of the present disclosure.

The projection of the contact surface between the organic encapsulation layer and the first inorganic encapsulation layer on the substrate is as shown in FIG. 2, and the peripheral contact surface 10 surrounds the middle contact surface 9.

Optionally, in the display panel provided by some embodiments of the present disclosure, the middle contact surface at least covers the display area.

In the display panel provided by some embodiments of the present disclosure, the middle contact surface at least covers the display area, that is, the peripheral contact surface is located in the peripheral area, thereby ensuring that the flowability of the organic materials in the display area is better than the flowability of the organic materials in the peripheral contact surface located in the peripheral area, preventing the organic materials from overflowing and crossing the retaining wall in the inkjet printing process while ensuring the planarization of the display area and preventing the water and oxygen from invading along the channel of the organic encapsulation layer.

Optionally, as shown in FIG. 1, the first inorganic encapsulation layer 6 includes: an inorganic encapsulation sublayer 11 covering the display area 1 and the peripheral area 2, and a flowability modulation layer 12 located on the inorganic encapsulation sublayer 11.

The surface energy of the inorganic encapsulation sublayer 11 is less than that of the flowability modulation layer 12.

The contact surface between the flowability modulation layer 12 and the organic encapsulation layer 7 is the middle contact surface 9.

The contact surface between the inorganic encapsulation sublayer 11 and the organic encapsulation layer 7 is the peripheral contact surface 10.

In the display panel provided by some embodiments of the present disclosure, the flowability of the organic materials on the flowability modulation layer is better than the flowability of the organic materials on the inorganic encapsulation sublayer, so that the organic materials can be prevented from overflowing and crossing the retaining wall, and the water and oxygen can be prevented from invading along the channel of the organic encapsulation layer.

In the case that the contact surface between the flowability modulation layer and the organic encapsulation layer is the middle contact surface, optionally, the flowability modulation layer at least covers the display area.

In the display panel provided by some embodiments of the present disclosure, by at least arranging the flowability modulation layer on the part, located in the display area, of the inorganic encapsulation sublayer, the flowability of the organic materials in the display area is better than the flowability of the organic materials in the peripheral contact surface located in the peripheral area, thereby preventing the organic materials from overflowing and crossing the retaining wall in the inkjet printing process while ensuring the planarization of the display area and preventing the water and oxygen from invading along the channel of the organic encapsulation layer.

In FIG. 1, an example in which the flowability modulation layer 12 only covers the display area is used for illustration. Of course, in a specific implementation, considering the process precision, the flowability modulation layer may also cover part of the peripheral area.

In the case that the contact surface between the flowability modulation layer and the organic encapsulation layer is the middle contact surface, optionally, the materials of the inorganic encapsulation sublayer include: silicon oxynitride; and the materials of the flowability modulation layer include: silicon oxide.

Optionally, as shown in FIG. 3, the first inorganic encapsulation layer 6 includes: an inorganic encapsulation sublayer 11 covering the display area 1 and the peripheral area 2, and a flowability modulation layer 12 located on the inorganic encapsulation sublayer 11.

The surface energy of the inorganic encapsulation sublayer 11 is greater than that of the flowability modulation layer 12.

The contact surface between the flowability modulation layer 12 and the organic encapsulation layer 7 includes the peripheral contact surface 10.

The contact surface between the inorganic encapsulation sublayer and the organic encapsulation layer is the middle contact surface.

In the display panel provided by some embodiments of the present disclosure, the flowability of the organic materials on the inorganic encapsulation sublayer is better than the flowability of the organic materials on the flowability modulation layer, so that the organic materials can be prevented from overflowing and crossing the retaining wall in the inkjet printing process, and the water and oxygen can be prevented from invading along the channel of the organic encapsulation layer.

Optionally, as shown in FIG. 3, the flowability modulation layer 12 is located in the peripheral area 2.

Thus, the flowability of the organic materials in the display area is better than the flowability of the organic materials in the peripheral area, thereby preventing the organic materials from overflowing and crossing the retaining wall in the inkjet printing process while ensuring the planarization of the display area and preventing the water and oxygen from invading along the channel of the organic encapsulation layer.

Optionally, as shown in FIG. 3, the area of the flowabilty modulation layer 12 is larger than that of the peripheral contact surface 10.

In the display panel provided by some embodiments of the present disclosure, the area of the flowabilty modulation layer is larger than that of the peripheral contact surface, that is, the flowability modulation layer further includes an area which is not covered by the organic encapsulation layer, and the area which is not covered by the organic encapsulation layer is near to the retaining wall, so that the organic materials can be further prevented from overflowing and crossing the retaining wall in the inkjet printing process.

In the case that the flowability modulation layer is arranged in the peripheral area, optionally, the materials of the inorganic encapsulation sublayer include: silicon oxide; and the materials of the flowability modulation layer include: silicon oxynitride.

When the first inorganic encapsulation layer includes the flowability modulation layer, optionally, the thickness of the flowability modulation layer is 100 to 1000 angstroms.

The display panel provided by some embodiments of the present disclosure may also be a touch control display panel. Optionally, the display panel further includes a touch control structure located on the encapsulation structure.

Based on the same inventive concept, an embodiment of the present disclosure further provides a preparation method of a display panel, as shown in FIG. 4, the method includes:

S101, providing a substrate and forming a light emitting device and a retaining wall on the substrate; wherein the display panel is divided into a display area and a peripheral area surrounding the display area, the light emitting device is located in the display area, and the retaining wall is located in the peripheral area;

S102, forming a first inorganic encapsulation layer covering the display area and the peripheral area;

S103, forming a pattern of an organic encapsulation layer covering the display area and at least part of the peripheral area on the first inorganic encapsulation layer, wherein there is a gap between the organic encapsulation layer and the retaining wall, the contact surface between the organic encapsulation layer and the first inorganic encapsulation layer includes a middle contact surface and a peripheral contact surface surrounding the middle contact surface, and the surface energy of the middle contact surface is greater than that of the peripheral contact surface; and S104, forming a second inorganic encapsulation layer covering the display area and the peripheral area on the organic encapsulation layer.

In the preparation method of the display panel provided by some embodiments of the present disclosure, the contact surface between the first inorganic encapsulation layer and the organic encapsulation layer includes the middle contact surface and the peripheral contact surface, and the surface energy of the middle contact surface is greater than that of the peripheral contact surface, that is, the flowability of the organic materials in the different areas can be controlled, and the flowability of the organic materials in the middle contact surface is better than the flowability of the organic materials in the peripheral contact surface, so that the organic materials can be prevented from overflowing and crossing the retaining wall, the invasion of the water and oxygen along a channel of the organic encapsulation layer can be avoided, and the reliability of encapsulation can be further ensured.

In the preparation method of the display panel provided by some embodiments of the present disclosure, for example, a chemical vapor deposition (CVD) process may be adopted for forming the first inorganic encapsulation layer and forming the second inorganic encapsulation layer, and an inkjet printing process may be adopted for forming the organic encapsulation layer.

Optionally, the step S102 of forming a first inorganic encapsulation layer covering the display area and the peripheral area includes:

performing whole-layer deposition of inorganic materials to form an inorganic encapsulation sublayer covering the display area and the peripheral area; and forming a pattern of a flowability modulation layer at least covering the display area on the inorganic encapsulation sublayer; wherein the surface energy of the inorganic encapsulation sublayer is less than that of the flowability modulation layer, and the contact surface between the flowability modulation layer and the organic encapsulation layer is the middle contact surface.

In the preparation method of the display panel provided by some embodiments of the present disclosure, the formed flowability modulation layer at least covers the display area, and the surface energy of the flowability modulation layer is greater than that of the inorganic encapsulation sublayer, thereby ensuring that the flowability of the organic materials in the display area is better than the flowability of the organic materials in the peripheral area, preventing the organic materials from overflowing and crossing the retaining wall in the inkjet printing process while ensuring the planarization of the display area and preventing the water and oxygen from invading along the channel of the organic encapsulation layer.

Optionally, the step S102 of forming a first inorganic encapsulation layer covering the display area and the peripheral area includes:

performing whole-layer deposition of inorganic materials to form an inorganic encapsulation sublayer covering the display area and the peripheral area; and forming a pattern of a flowability modulation layer on the part, located in the peripheral area, of the inorganic encapsulation sublayer; wherein the surface energy of the inorganic encapsulation sublayer is greater than that of the flowability modulation layer, and the contact surface between the flowability modulation layer and the organic encapsulation layer is the peripheral contact surface.

In the preparation method of the display panel provided by some embodiments of the present disclosure, the formed flowability modulation layer covers the peripheral area, and the surface energy of the flowability modulation layer is less than that of the inorganic encapsulation sublayer, thereby ensuring that the flowability of the organic materials in the display area is better than the flowability of the organic materials in the peripheral area, preventing the organic materials from overflowing and crossing the retaining wall in the inkjet printing process while ensuring the planarization of the display area and preventing the water and oxygen from invading along the channel of the organic encapsulation layer.

Optionally, after the step S104, the method further includes the step of forming a touch control structure on the second inorganic encapsulation layer.

The step of forming a touch control structure specifically includes:

forming a first insulation layer, a first electrode layer and a second insulation layer in sequence; and performing a patterning process on the second insulation layer and the inorganic encapsulation sublayer simultaneously to form a pattern of the inorganic encapsulation sublayer.

In the preparation method of the display panel provided by some embodiments of the present disclosure, an FMLOC process is utilized to form the touch control structure, that is, the touch control structure is directly formed on the encapsulation structure, and the additional setting of a touch control screen is not required. Furthermore, the inorganic encapsulation sublayer is formed by the whole-layer deposition, the process of forming the inorganic encapsulation sublayer does not need to adopt a mask, and the redundant inorganic encapsulation sublayer is removed in an etching process of the FMLOC process, thereby saving one mask and saving the cost.

After performing the patterning process on the second insulation layer and removing the redundant inorganic encapsulation sublayer, the FMLOC process further includes the step of forming a second electrode layer and a third insulation layer. The first insulation layer, the second insulation layer and the third insulation layer may be inorganic insulation layers.

Figure 5:
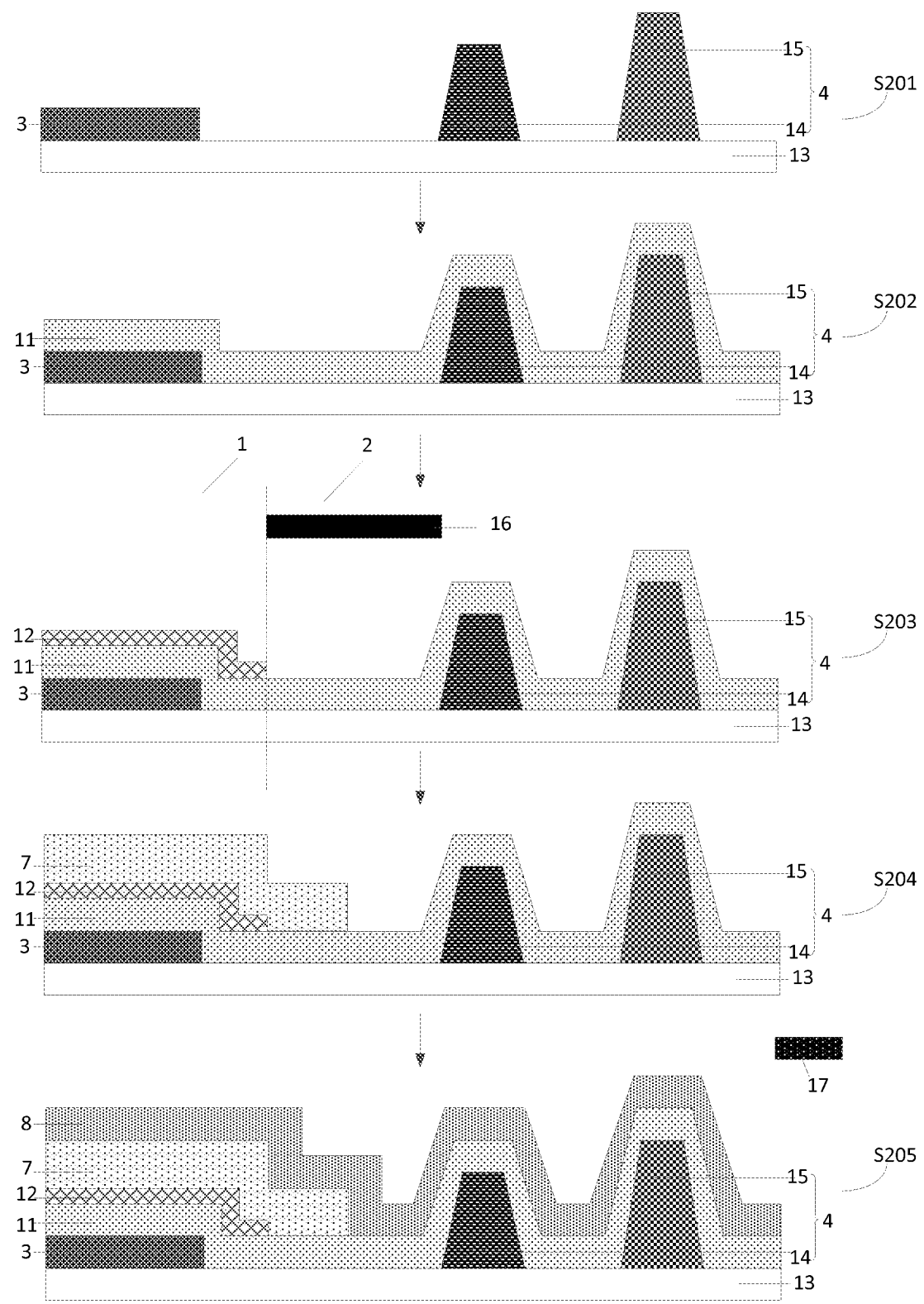
FIG. 5 is a schematic diagram of another preparation method of a display panel provided by an embodiment of the present disclosure.

Next, an example in which the flowability modulation layer covers the display area is used to illustrate the preparation method of the display panel provided by some embodiments of the present disclosure. As shown in FIG. 5, the preparation method of the display panel includes:

S201, forming a light emitting device 3 and a retaining wall 4 on a substrate 13;

S202, depositing a whole layer of silicon oxynitride by a CVD process to form an inorganic encapsulation sublayer 11;

S203, depositing silicon oxide by utilizing a first mask 16 with an opening and adopting the CVD process to form a pattern of a flowability modulation layer 12 covering a display area 1;

S204, forming an organic encapsulation layer 7 by an inkjet printing process; and S205, depositing silicon nitride by utilizing a second mask 17 with an opening and adopting the CVD process to form a second inorganic encapsulation layer 8.

An embodiment of the present disclosure provides a display device, and the display device includes the display panel provided by some embodiments of the present disclosure.

The display device provided by some embodiments of the present disclosure may be, for example, a mobile phone, a tablet computer, a TV and the like.

In summary, in the display panel, the preparation method of the display panel and the display device provided by embodiments of the present disclosure, the contact surface between the first inorganic encapsulation layer and the organic encapsulation layer includes the middle contact surface and the peripheral contact surface, and the surface energy of the middle contact surface is greater than that of the peripheral contact surface, that is, the flowability of the organic materials in the different areas can be controlled, and the flowability of the organic materials in the middle contact surface is better than the flowability of the organic materials in the peripheral contact surface, so that the organic materials can be prevented from overflowing and crossing the retaining wall in the inkjet printing process, the invasion of the water and oxygen along a channel of the organic encapsulation layer can be avoided, and the reliability of encapsulation can be further ensured.

Obviously, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A display panel, comprising, a substrate, a light emitting device and a retaining wall on the substrate, and a encapsulation structure; wherein the display panel is divided into a display area and a peripheral area surrounding the display area;
the light emitting device is in the display area, the retaining wall is in the peripheral area, and the encapsulation structure is in the display area and the peripheral area covering the retaining wall and the light emitting device;
the encapsulation structure comprises: a first inorganic encapsulation layer, an organic encapsulation layer located on the first inorganic encapsulation layer, and a second inorganic encapsulation layer located on the organic encapsulation layer;
the first inorganic encapsulation layer and the second inorganic encapsulation layer cover the display area and the peripheral area;
the organic encapsulation layer covers the display area and at least part of the peripheral area, there is a gap between the organic encapsulation layer and the retaining wall, and an orthogonal projection of the organic encapsulation layer on the substrate and an orthogonal projection of the retaining wall on the substrate do not have an overlapped area; and
a contact surface between the organic encapsulation layer and the first inorganic encapsulation layer comprises a middle contact surface and a peripheral contact surface surrounding the middle contact surface, and a surface energy of the middle contact surface is greater than a surface energy of the peripheral contact surface;
wherein the first inorganic encapsulation layer comprises: an inorganic encapsulation sublayer covering the display area and the peripheral area, and a flowability modulation layer located on the inorganic encapsulation sublayer;
a surface energy of the inorganic encapsulation sublayer is greater than a surface energy of the flowability modulation layer; and
a contact surface between the flowability modulation layer and the organic encapsulation layer comprises the peripheral contact surface.

2. The display panel according to claim 1, wherein an area of the flowabilty modulation layer is larger than an area of the peripheral contact surface.

3. The display panel according to claim 1, wherein materials of the inorganic encapsulation sublayer comprise silicon oxide; and
materials of the flowability modulation layer comprise silicon oxynitride.

4. The display panel according to claim 1, wherein the middle contact surface at least covers the display area.

5. A preparation method of a display panel, wherein the method comprises:
providing a substrate and forming a light emitting device and a retaining wall on the substrate; wherein the display panel is divided into a display area and a peripheral area surrounding the display area, the light emitting device is located in the display area, and the retaining wall is located in the peripheral area;
forming a first inorganic encapsulation layer covering the display area and the peripheral area;
forming a pattern of an organic encapsulation layer covering the display area and at least part of the peripheral area on the first inorganic encapsulation layer, wherein there is a gap between the organic encapsulation layer and the retaining wall, an orthogonal projection of the organic encapsulation layer on the substrate and an orthogonal projection of the retaining wall on the substrate do not have an overlapped area, a contact surface between the organic encapsulation layer and the first inorganic encapsulation layer comprises a middle contact surface and a peripheral contact surface surrounding the middle contact surface, and a surface energy of the middle contact surface is greater than a surface energy of the peripheral contact surface; and
forming a second inorganic encapsulation layer covering the display area and the peripheral area on the organic encapsulation layer;
wherein the forming a first inorganic encapsulation layer covering the display area and the peripheral area comprises:
performing whole-layer deposition of inorganic materials to form an inorganic encapsulation sublayer covering the display area and the peripheral area; and
forming a pattern of a flowability modulation layer on a part, located in the peripheral area, of the inorganic encapsulation sublayer; wherein a surface energy of the inorganic encapsulation sublayer is greater than a surface energy of the flowability modulation layer, and a contact surface between the flowability modulation layer and the organic encapsulation layer is the peripheral contact surface.

6. The method according to claim 5, further comprising forming a touch control structure on the second inorganic encapsulation layer;
the forming a touch control structure comprises:
forming a first insulation layer, a first electrode layer and a second insulation layer in sequence; and
performing a patterning process on the second insulation layer and the inorganic encapsulation sublayer simultaneously to form a pattern of the inorganic encapsulation sublayer.

7. A display device, wherein the display device comprises the display panel according to claim 1.

8. The display device according to claim 7, wherein an area of the flowabilty modulation layer is larger than an area of the peripheral contact surface.

9. The display device according to claim 7, wherein materials of the inorganic encapsulation sublayer comprise silicon oxide; and
materials of the flowability modulation layer comprise silicon oxynitride.

10. The display device according to claim 7, wherein the middle contact surface at least covers the display area.

11. A display panel, comprising, a substrate, a light emitting device and a retaining wall on the substrate, and a encapsulation structure; wherein the display panel is divided into a display area and a peripheral area surrounding the display area;
the light emitting device is in the display area, the retaining wall is in the peripheral area, and the encapsulation structure is in the display area and the peripheral area covering the retaining wall and the light emitting device;
the encapsulation structure comprises: a first inorganic encapsulation layer, an organic encapsulation layer located on the first inorganic encapsulation layer, and a second inorganic encapsulation layer located on the organic encapsulation layer;

the first inorganic encapsulation layer and the second inorganic encapsulation layer cover the display area and the peripheral area;

the organic encapsulation layer covers the display area and at least part of the peripheral area, there is a gap between the organic encapsulation layer and the retaining wall, and an orthogonal projection of the organic encapsulation layer on the substrate and an orthogonal projection of the retaining wall on the substrate do not have an overlapped area; and a contact surface between the organic encapsulation layer and the first inorganic encapsulation layer comprises a middle contact surface and a peripheral contact surface surrounding the middle contact surface, and a surface energy of the middle contact surface is greater than a surface energy of the peripheral contact surface;

wherein the first inorganic encapsulation layer comprises:
an inorganic encapsulation sublayer covering the display area and the peripheral area, and a flowability modulation layer located on the inorganic encapsulation sublayer;

a surface energy of the inorganic encapsulation sublayer is less than a surface energy of the flowability modulation layer; and a contact surface between the flowability modulation layer and the organic encapsulation layer is the middle contact surface.

12. The display panel according to claim 11, wherein materials of the inorganic encapsulation sublayer comprise silicon oxynitride; and materials of the flowability modulation layer comprise silicon oxide.

13. The display panel according to claim 11, wherein the middle contact surface at least covers the display area.

14. A method for preparing the display panel according to claim 11, wherein the method comprises:

providing the substrate and forming the light emitting device and the retaining wall on the substrate; wherein the display panel is divided into the display area and the peripheral area surrounding the display area, the light emitting device is located in the display area, and the retaining wall is located in the peripheral area;

forming the first inorganic encapsulation layer covering the display area and the peripheral area;

forming a pattern of the organic encapsulation layer covering the display area and at least part of the peripheral area on the first inorganic encapsulation layer, wherein there is the gap between the organic encapsulation layer and the retaining wall, the orthogonal projection of the organic encapsulation layer on the substrate and the orthogonal projection of the retaining wall on the substrate do not have the overlapped area, the contact surface between the organic encapsulation layer and the first inorganic encapsulation layer comprises the middle contact surface and the peripheral contact surface surrounding the middle contact surface, and the surface energy of the middle contact surface is greater than the surface energy of the peripheral contact surface; and forming the second inorganic encapsulation layer covering the display area and the peripheral area on the organic encapsulation layer;

wherein the forming the first inorganic encapsulation layer covering the display area and the peripheral area comprises:

performing whole-layer deposition of inorganic materials to form the inorganic encapsulation sublayer covering the display area and the peripheral area; and forming a pattern of the flowability modulation layer at least covering the display area on the inorganic encapsulation sublayer; wherein the surface energy of the inorganic encapsulation sublayer is less than the surface energy of the flowability modulation layer, and the contact surface between the flowability modulation layer and the organic encapsulation layer is the middle contact surface.

15. The method according to claim 14, further comprising forming a touch control structure on the second inorganic encapsulation layer;

the forming a touch control structure comprises:
forming a first insulation layer, a first electrode layer and a second insulation layer in sequence; and performing a patterning process on the second insulation layer and the inorganic encapsulation sublayer simultaneously to form a pattern of the inorganic encapsulation sublayer.

16. A display device, wherein the display device comprises the display panel according to claim 11.

17. The display device according to claim 16, wherein materials of the inorganic encapsulation sublayer comprise silicon oxynitride; and materials of the flowability modulation layer comprise silicon oxide.

18. The display device according to claim 16, wherein the middle contact surface at least covers the display area.

* * * * *